(12) United States Patent
Yang et al.

(10) Patent No.: US 8,227,804 B2
(45) Date of Patent: Jul. 24, 2012

(54) ORGANIC LIGHT-EMITTING DISPLAY DEVICE

(75) Inventors: Huiwon Yang, Yongin (KR); Ki-Ju Im, Yongin (KR); Chaun-Gi Choi, Yongin (KR); Eun-Hyun Kim, Yongin (KR); Steve Y. G. Mo, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 0 days.

(21) Appl. No.: 13/023,686

(22) Filed: Feb. 9, 2011

(65) Prior Publication Data

US 2011/0198584 A1   Aug. 18, 2011

(30) Foreign Application Priority Data

Feb. 16, 2010   (KR) .................. 10-2010-0013845

(51) Int. Cl.
    *H01L 29/10*   (2006.01)
(52) U.S. Cl. ............................ 257/43; 257/79
(58) Field of Classification Search .................... 257/43, 257/79
    See application file for complete search history.

(56) References Cited

U.S. PATENT DOCUMENTS

| 8,053,773 | B2 * | 11/2011 | Shin et al. ................ 257/43 |
| 2008/0197350 | A1 | 8/2008 | Park et al. |
| 2008/0303020 | A1 | 12/2008 | Shin et al. |
| 2009/0001374 | A1 | 1/2009 | Inoue et al. |
| 2009/0108304 | A1 | 4/2009 | Ng et al. |
| 2009/0141203 | A1 | 6/2009 | Son et al. |
| 2009/0167974 | A1 | 7/2009 | Choi et al. |
| 2010/0006833 | A1 | 1/2010 | Ha et al. |
| 2010/0051936 | A1 | 3/2010 | Hayashi et al. |
| 2010/0065837 | A1 | 3/2010 | Omura et al. |

FOREIGN PATENT DOCUMENTS

| JP | 2007235102 | 9/2007 |
| JP | 2007258675 | 10/2007 |
| JP | 2008166716 | 7/2008 |
| JP | 2009135380 A | 6/2009 |
| KR | 1020080076608 | 8/2008 |
| KR | 100873081 B | 12/2008 |
| KR | 20090057689 | 6/2009 |
| KR | 20090069806 | 7/2009 |
| KR | 1020090105561 | 10/2009 |
| KR | 1020100005900 | 1/2010 |

OTHER PUBLICATIONS

Korean Notice of Allowance issued on Oct. 31, 2011 in connection with Korean Patent Application Serial No. 10-2010-0013845 and Request for Entry of the Accompanying Office Action attached herewith.

Korean Office Action issued by KIPO, dated May 17, 2011, corresponding to Korean Patent Application No. 10-2010-0013845, together with Request for Entry.

* cited by examiner

*Primary Examiner* — Douglas Menz
(74) *Attorney, Agent, or Firm* — Robert E. Bushnell, Esq.

(57) ABSTRACT

An organic light-emitting display device including: a gate electrode formed on a substrate; a first insulating layer formed on the gate electrode; an active layer formed on the first insulating layer, facing the gate electrode; a second insulating layer formed on the first insulating layer, having first openings to expose the active layer; source/drain electrodes formed on the second insulating layer, so as to be connected to exposed portions of the active layer through the first openings; and a metal layer formed on the active layer and contacting the second insulating layer.

10 Claims, 10 Drawing Sheets

ORGANIC LIGHT-EMITTING DISPLAY DEVICE

CROSS-REFERENCE TO RELATED APPLICATION

This application claims the benefit of Korean Patent Application No. 10-2010-0013845, filed on Feb. 16, 2010, in the Korean Intellectual Property Office, the disclosure of which is incorporated herein, by reference.

BACKGROUND

1. Field

Aspects of the present invention relate to an organic light-emitting display device including an improved active layer.

2. Description of the Related Art

Organic light-emitting display devices include a thin film transistor (TFT) and an organic light-emitting device. The organic light-emitting device receives a driving signal from the TFT, to emit light and form a desired image.

The TFT has a structure in which a gate electrode, an active layer, source/drain electrodes, or the like, are stacked. The active layer is formed of an oxide semiconductor that does not require a recrystallization process and has good uniformity, due to its amorphous state. However, when water or oxygen contacts the oxide semiconductor, the performance of the active layer is significantly reduced. Accordingly, the active layer should be protected from water and/or oxygen, to prevent the degradation of the active layer.

SUMMARY

Aspects of the present invention provide an organic light-emitting display device including an active layer that is protected from the infiltration of water and/or oxygen.

According to an aspect of the present invention, there is provided an organic light-emitting display device comprising: a gate electrode formed on a substrate; a first insulating layer formed on the gate electrode; an active layer formed on the first insulating layer, facing the gate electrode; a second insulating layer formed on the first insulating layer, having first openings to expose the active layer; source/drain electrodes formed on the second insulating layer, extending through the first openings to contact the exposed portions of the active layer; and a metal layer formed on the active layer, contacting the second insulating layer.

According to various embodiments, the metal layer may be interposed between the active layer and the second insulating layer, so as to directly contact and cover a central portion of the active layer.

According to various embodiments, the metal layer may be formed on the second insulating layer, so as to be directly connected to a central portion of the active layer, through a second opening formed in the second insulating layer, and may be coplanar with the source/drain electrodes.

According to various embodiments, the active layer may comprise an oxide semiconductor.

According to various embodiments, the organic light-emitting display device may further comprise a buffer layer disposed between the substrate and the gate electrode, to planarize the substrate.

According to aspects of the present invention, an organic light-emitting display device includes a metal layer to protect an active layer from damage due to the penetration of water and/or oxygen. Accordingly, the lifespan of the organic light-emitting display device may be increased, and an image may be formed more stably thereby.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
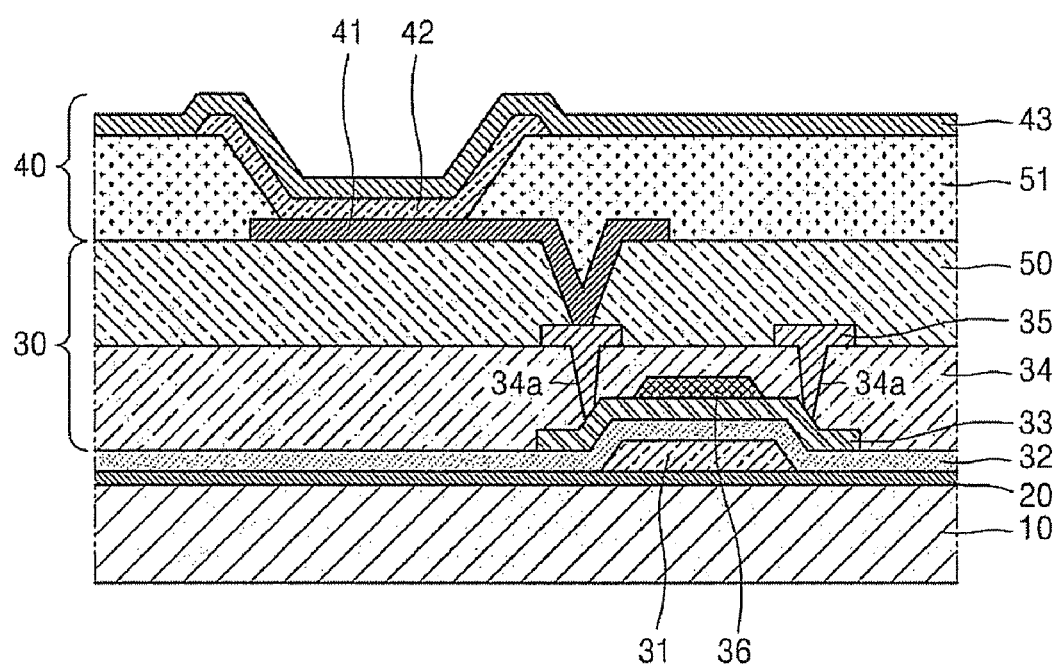
FIG. 1 is a cross-sectional view illustrating an organic light-emitting display device, according to an exemplary embodiment of the present invention.

Reference will now be made in detail to the exemplary embodiments of the present invention, examples of which are illustrated in the accompanying drawings, wherein like reference numerals refer to the like elements throughout. The exemplary embodiments are described below, in order to explain the aspects of the present invention, by referring to the figures.

As referred to herein, when a first element is said to be disposed or formed "on" a second element, the first element can directly contact the second element, or can be separated from the second element by one or more other elements located therebetween. In contrast, when an element is referred to as being disposed or formed "directly on" another element, there are no intervening elements present.

FIG. 1 is a cross-sectional view illustrating an organic light-emitting display device, according to an exemplary embodiment of the present invention. Referring to FIG. 1, the organic light-emitting display device includes a thin film transistor (TFT) 30 and an organic light-emitting device 40, which are formed on a substrate 10. In FIG. 1, only one pixel of the organic light-emitting display device is illustrated; however, the organic light-emitting display device includes a plurality of such pixels.

The organic light-emitting device 40 is electrically connected to the TFT 30, and light is emitted thereby. The organic light-emitting device 40 includes a pixel electrode 41 included in each pixel, an opposite electrode 43 (common electrode), and an organic emission layer 42 interposed between the pixel electrode 41 and the opposite electrode 43. Accordingly, as a voltage is applied to the pixel electrode 41, to set an adequate voltage condition between the pixel electrode 41 and the opposite electrode 43, light is emitted by the organic emission layer 42.

In a top emission-type organic light-emitting display device, in which an image is formed toward the opposite electrode 43, the pixel electrode 41 may be a reflective electrode. To this end, the pixel electrode 41 may include a reflection layer formed of an alloy of, for example, Al, Ag, or the like.

When the pixel electrode 41 operates as an anode electrode, the pixel electrode 41 includes a layer formed of a metal oxide having a high work function (absolute value), such as indium tin oxide (ITO), indium zinc oxide (IZO), ZnO, etc. When the pixel electrode 41 operates as a cathode electrode, the pixel electrode 41 may be formed of a highly conductive metal having a low work function (absolute value), such as Ag, Mg, Al, Pt, Pd, Au, Ni, Nd, Ir, Cr, Li, or Ca.

The opposite electrode 43 may be a transparent electrode. To this end, the opposite electrode 43 may include a semi-transparent reflection layer formed of a thin film of, for example, Ag, Mg, Al, Pt, Pd, Au, Ni, Nd, Ir, Cr, Li, or Ca, or a transparent metal oxide such as ITO, IZO, or ZnO. When the pixel electrode 41 operates as an anode electrode, the opposite electrode 43 operates as a cathode electrode and vice versa.

The organic emission layer 42 is interposed between the pixel electrode 41 and the opposite electrode 43 and may include a light-emitting layer and optionally a hole injection-transport layer, an emission layer, an electron injection-transport layer, or a combination thereof. Although not shown in FIG. 1, a protection layer may be further formed on the opposite electrode 43, and the organic light-emitting display device may be sealed using a transparent substrate.

The TFT 30 includes a gate electrode 31 formed on the substrate 10, a first insulating layer 32 (gate insulating layer) covering the gate electrode 31, an active layer 33 formed on the first insulating layer 32, a second insulating layer 34 (etch stop layer) formed on the first insulating layer 32 covering the active layer 33, and source/drain electrodes 35 that are each connected to the active layer 33, via first openings 34a of the second insulating layer 34. A metal layer 36 covers a central portion of the active layer 33 and is formed between the active layer 33 and the second insulating layer 34. The metal layer 36 covers the central portion of the active layer 33, which operates as a channel. The metal layer may be trapezoidal in cross-section.

The TFT 30 includes a buffer layer 20 formed of an inorganic material, such as a silicon oxide, disposed on the substrate 10, to planarize the substrate 10. The gate electrode 31 may include one or more layers of a conductive metal. The gate electrode 31 may include molybdenum. The first insulating layer 32 may be formed of a silicon oxide, a tantalum oxide, or an aluminum oxide, but is not limited thereto.

The active layer 33 having a patterned form is formed on the first insulating layer 32. The active layer 33 may be formed of an oxide semiconductor that does not require a recrystallization process and has good uniformity, due to its amorphous state. For example, the active layer 33 may be a G-I-Z-O layer [a(In$_2$O$_3$)b(Ga$_2$O$_3$)c(ZnO) layer] (a, b, and c are real numbers that satisfy a≧0, b÷0, and c>0).

The metal layer 36 is formed directly on the active layer 33 to protect the active layer 33 from water and/or oxygen. That is, when the active layer 33 is formed of an oxide semiconductor in particular, the active layer 33 may be damaged by water and/or oxygen. Thus a central portion of the active layer 33 is covered with the metal layer 36, to protect the active layer 33. The metal layer 36 may be, for example, molybdenum. By using the metal layer 36, the penetration of oxygen and water is reduced/prevented.

The second insulating layer 34 is formed to cover the active layer 33 and the metal layer 36. The second insulating layer 34 may be formed of, for example, a silicon oxide, a tantalum oxide, or an aluminum oxide, but is not limited thereto.

The source/drain electrodes 35, which are formed of a conductive metal, are formed on the second insulating layer 34, so as to contact the active layer 33. A passivation layer 50 is formed on the second insulating layer 34, to cover the source/drain electrodes 35. The pixel electrode 41 of the organic light-emitting device 40 contacts one of the source/drain electrodes 35 and is formed on the passivation layer 50.

A pixel defining layer 51, exposing a portion of the pixel electrode 41, is formed on the passivation layer 50. The organic emission layer 42 and the opposite electrode 43 extend into the pixel defining layer 51 and are formed on the pixel electrode 41.

Figure 2A:
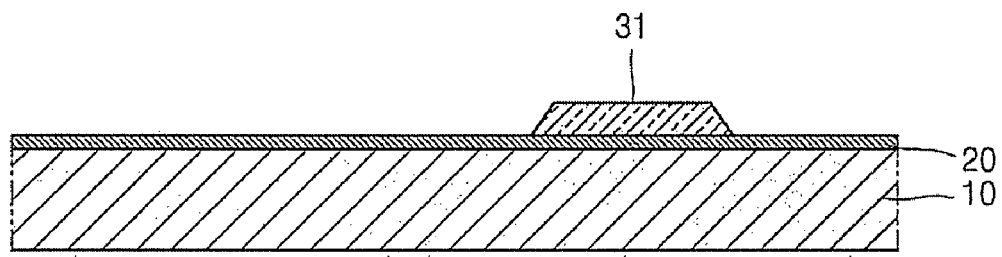
FIGS. 2A through 2I are cross-sectional views illustrating a method of manufacturing the organic light-emitting display device of FIG. 1, according to an exemplary embodiment of the present invention.

FIGS. 2A through 2I are cross-sectional views illustrating a method of manufacturing the organic light-emitting display device of FIG. 1, according to an exemplary embodiment of the present invention. Referring to FIG. 2A, a gate electrode 31 of a TFT 30 is formed on a buffer layer 20 disposed on a substrate 10. The buffer layer 20 planarizes the substrate 10, and may be optional.

Figure 2B:
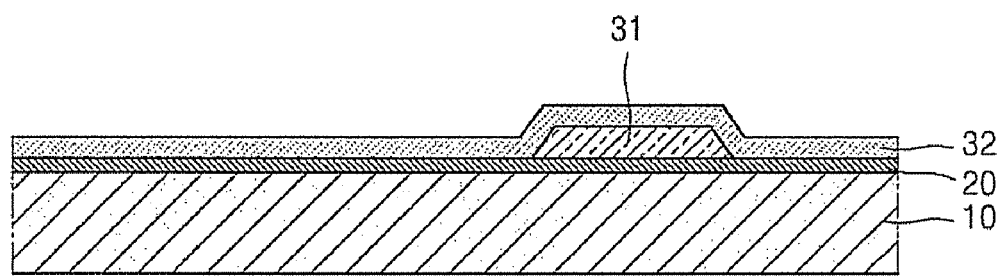
Figure 2C:
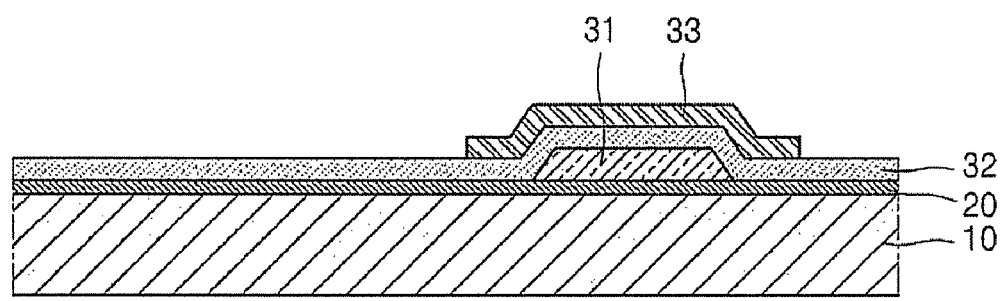

Referring to FIG. 2B, a first insulating layer 32 is formed on the gate electrode 31. Referring to FIG. 2C, an active layer 33 formed of, for example, an oxide semiconductor, is formed on the first insulating layer 32, facing the gate electrode 31.

Figure 2D:
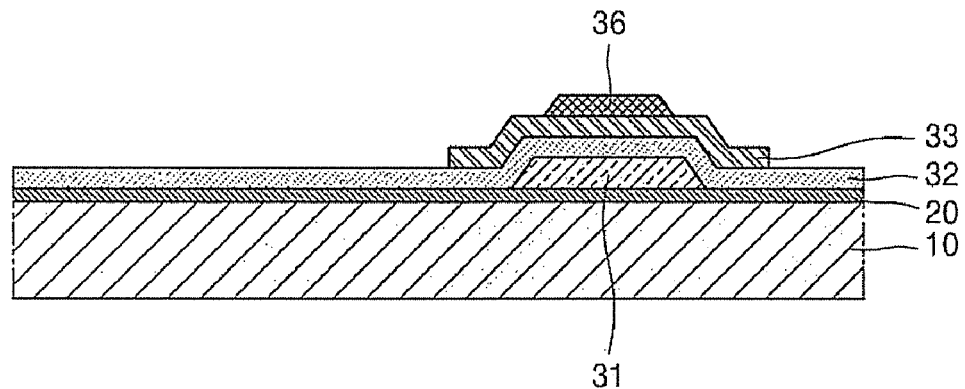

Referring to FIG. 2D, a metal layer 36 is formed on a central portion (channel) of the active layer 33. The metal layer 36 protects the central portion of the active layer 33 from water and/or oxygen.

Figure 2E:
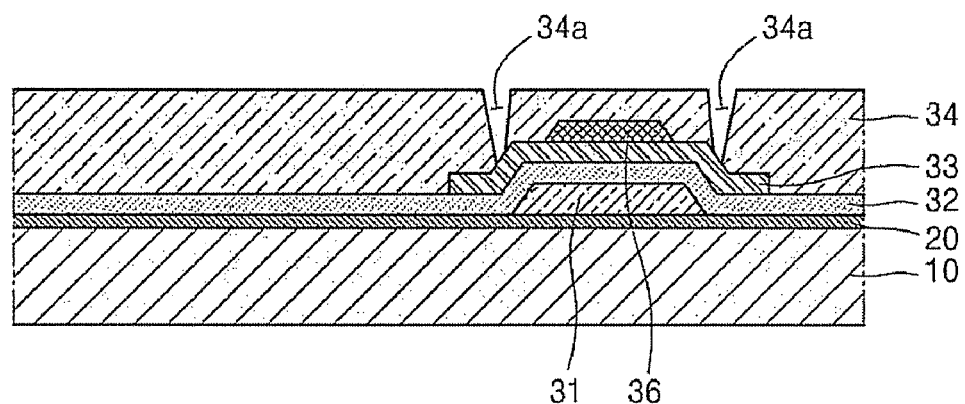

Referring to FIG. 2E, a second insulating layer 34 is formed on the first insulating layer 32 and the metal layer 36. The second insulating layer 34 has first openings 34a that expose portions of the active layer 33. The first openings 34a may be patterned, for example, by using a dry etching method.

Figure 2F:
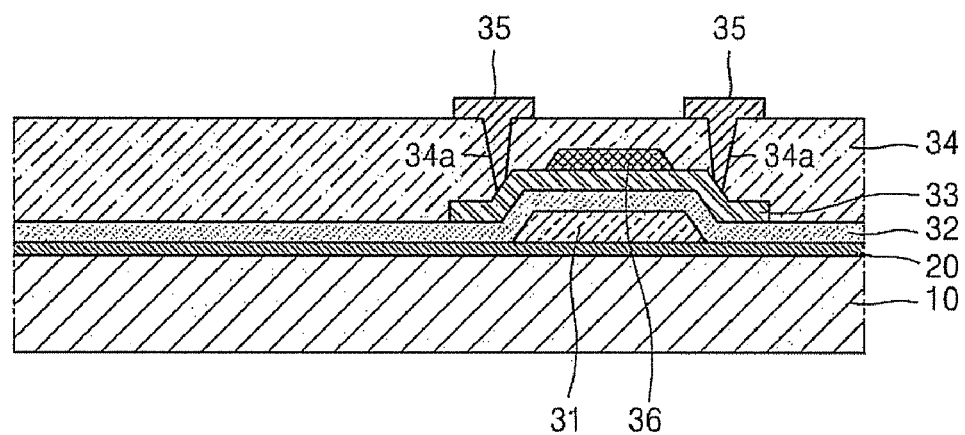
Figure 2G:
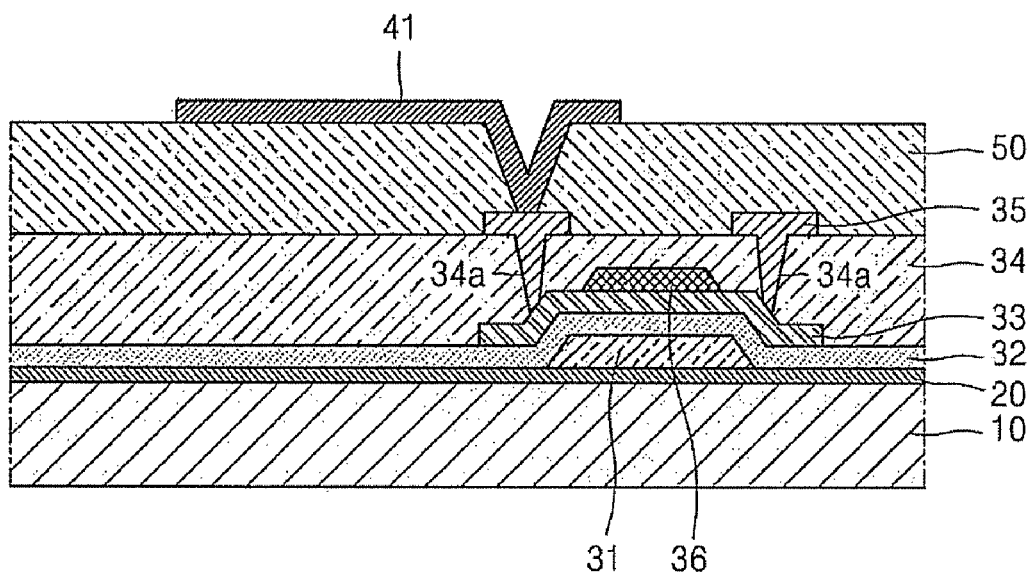
Figure 2H:
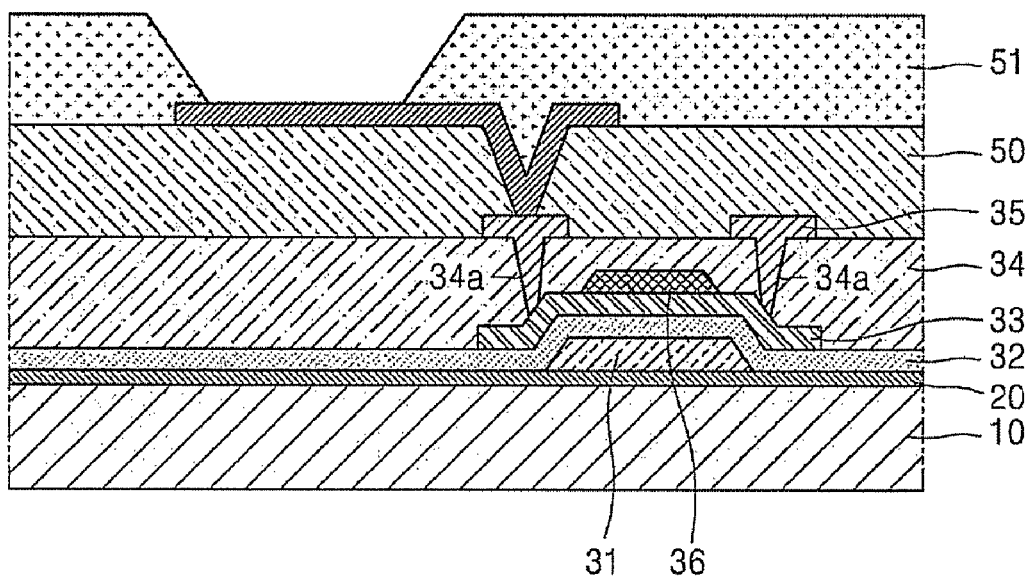

Referring to FIG. 2F, source/drain electrodes 35 are formed on the second insulating layer 34, so as to be connected to the active layer 33 via the first openings 34a. Referring to FIG. 2G, a passivation layer 50 is formed on the second insulating layer 34. A pixel electrode 41 is formed on the passivation layer 50 and is connected to one of the source/drain electrodes 35. A pixel defining layer 51 that partitions a pixel is formed on the passivation layer 50 and the pixel electrode 41, as illustrated in FIG. 2H.

Figure 2I:
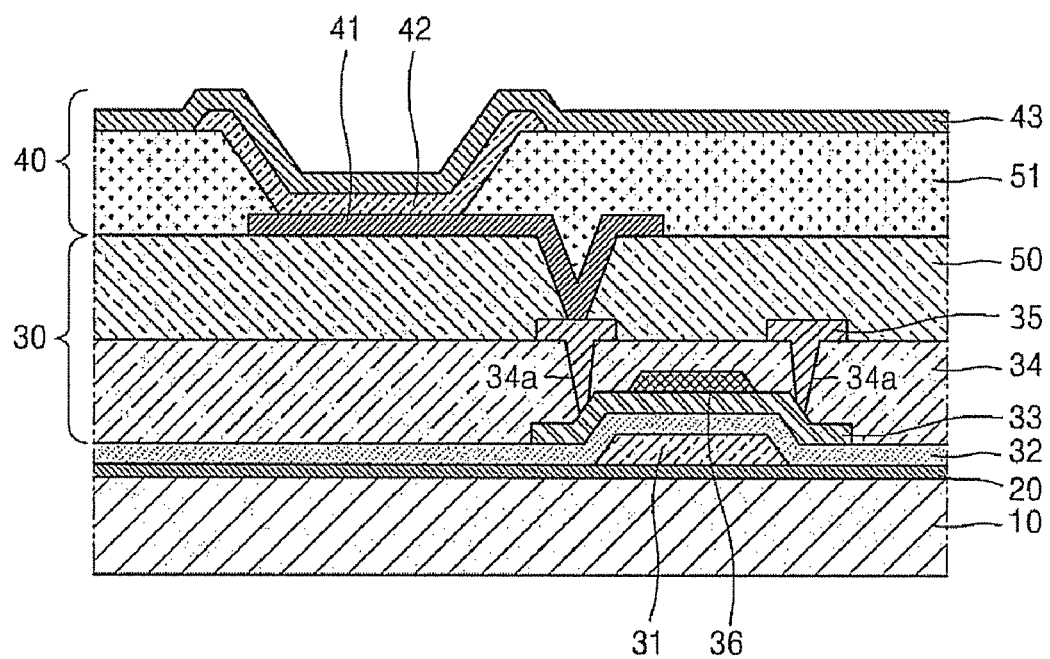

As shown in FIG. 2I, an organic emission layer 42 is formed on the pixel electrode 41, and an opposite electrode 43 is formed on the organic emission layer 42. Thus an organic light-emitting display device is manufactured. Although not shown, a protection layer is formed on the opposite electrode 43, and a transparent layer is formed to cover and seal the organic light-emitting display device.

Accordingly, the metal layer 36 covers the active layer 33, to protect the active layer 33 from the penetration of water and/or oxygen. Therefore, the lifespan of the organic light-emitting display device may be increased, and an image may be formed more stably thereby.

Figure 5A:
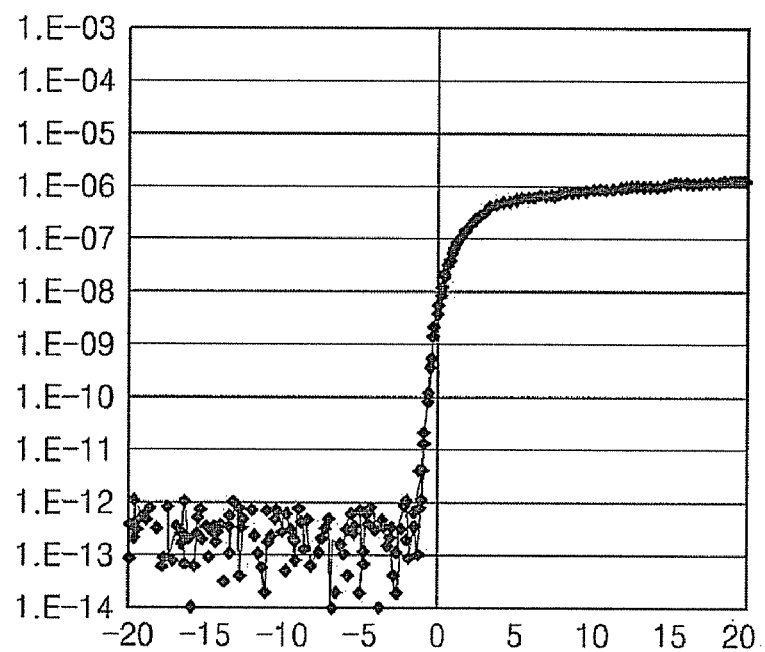
FIGS. 5A and 5B are graphs illustrating hysteresis characteristics of an organic light-emitting display device, according to an exemplary embodiment of the present invention and the hysteresis characteristics of a conventional organic light-emitting display device, respectively.
Figure 5B:
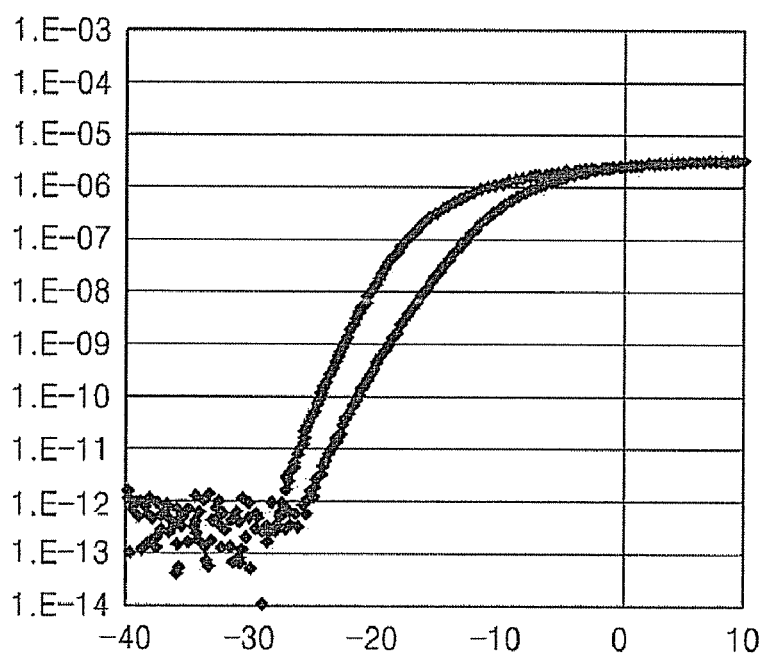

FIGS. 5A and 5B are graphs respectively illustrating hysteresis characteristics of an organic light-emitting display device, according to an exemplary embodiment of the present invention, and hysteresis characteristics of a conventional organic light-emitting display device that does not include a metal layer to protect an active layer. The conventional organic light-emitting display device undergoes a substantial amount of hysteresis, as illustrated in FIG. 5B. However, the present organic light-emitting display device undergoes very little hysteresis, as shown in FIG. 5A. In other words, because the active layer of the present organic light-emitting display device is stabilized, the device characteristics thereof are improved, as compared to the conventional device.

Figure 3:
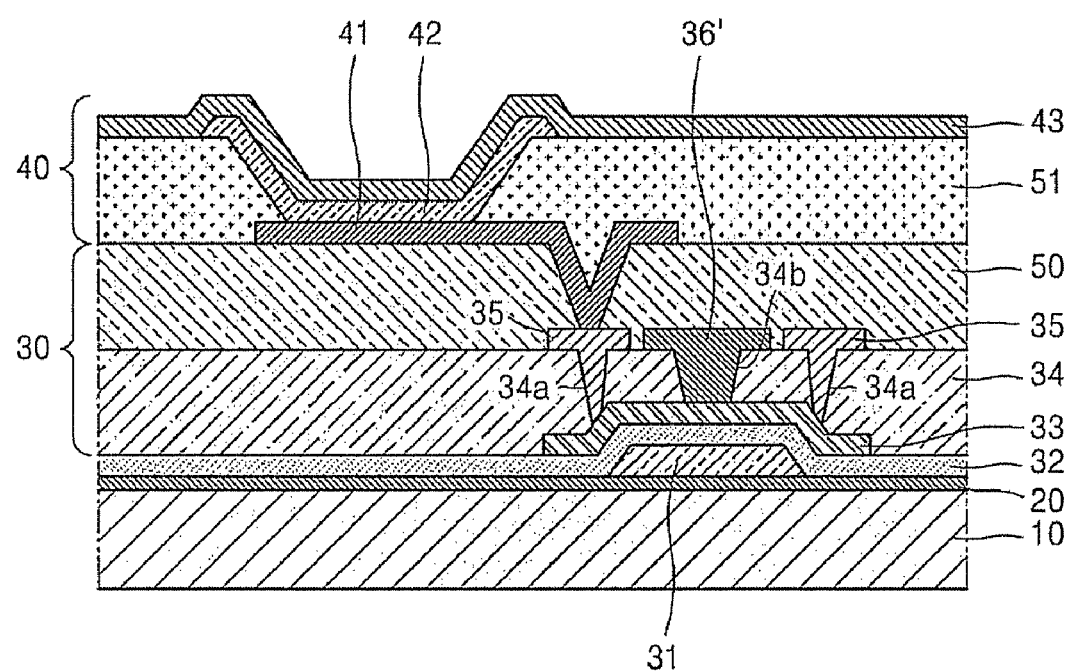
FIG. 3 is a cross-sectional view illustrating an organic light-emitting display device, according to another exemplary embodiment of the present invention.

FIG. 3 is a cross-sectional view illustrating an organic light-emitting display device, according to another exemplary embodiment of the present invention. The organic light-emitting display device of FIG. 3 is similar to that of FIG. 1, except for including a different metal layer 36. Like elements having the same functions as in the embodiment of FIG. 1 are referred with like reference numerals to help understand the structure thereof.

Figure 4A:
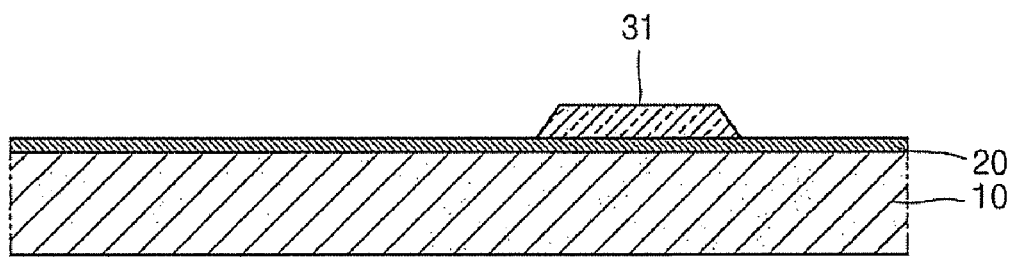
FIGS. 4A through 4H are cross-sectional views illustrating a method of manufacturing the organic light-emitting display device of FIG. 3, according to an exemplary embodiment of the present invention.
Figure 4B:
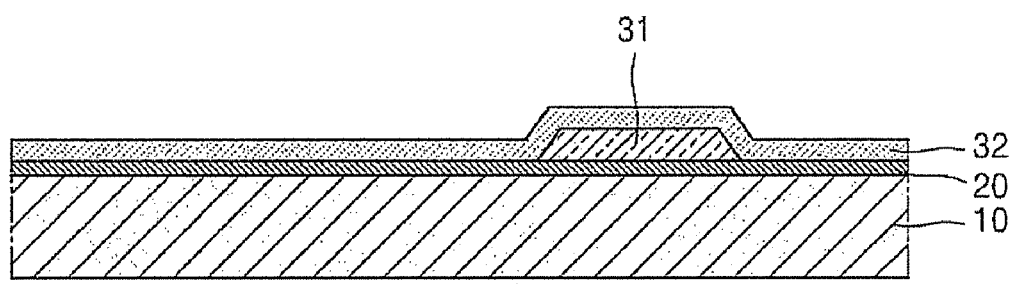
Figure 4C:
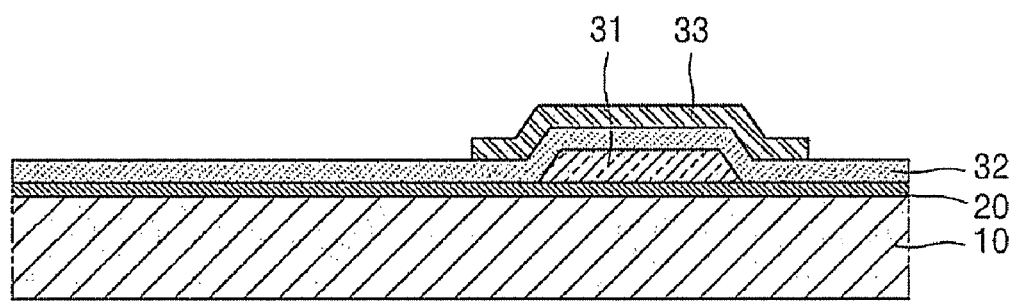

FIGS. 4A through 4H are cross-sectional views illustrating a method of manufacturing the organic light-emitting display device of FIG. 3, according to an exemplary embodiment of the present invention. As illustrated in FIG. 4A, a gate electrode 31 of a TFT 30 is formed on a buffer layer 20 disposed on a substrate 10, Referring to FIG. 4B, a first insulating layer 32 is formed on the gate electrode 31. Referring to FIG. 4C, an active layer 33 formed of, for example, an oxide semiconductor, is formed on the first insulating layer 32, facing the gate electrode 31.

Figure 4D:
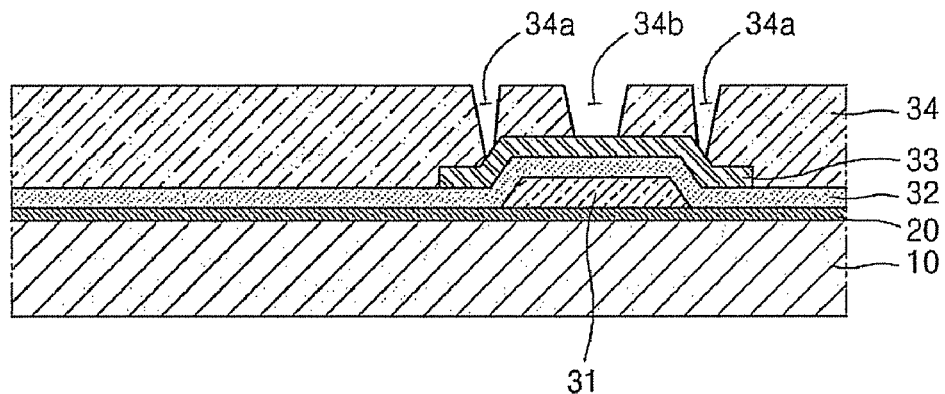

Referring to FIG. 4D, a second insulating layer 34 is formed on the first insulating layer 32. The second insulating layer 34 includes first and second openings 34a and 34b exposing portions of the active layer 33. The first and second openings 34a and 34b may be patterned, for example, by using a dry etching method.

Figure 4E:
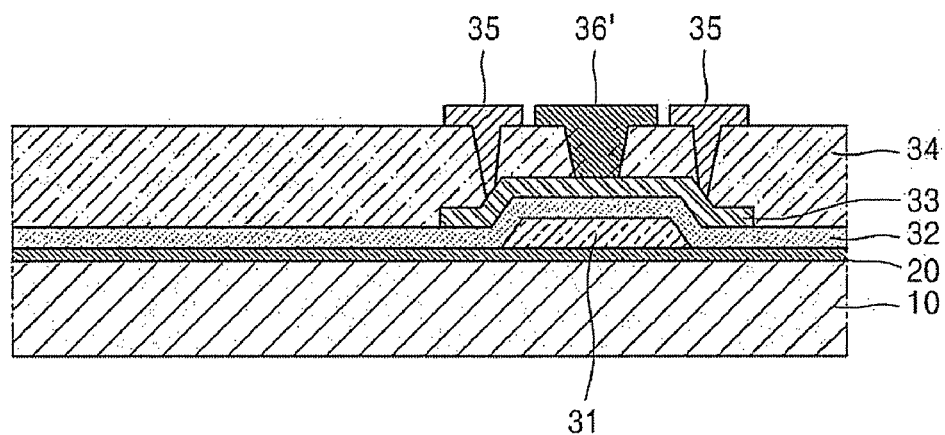

Referring to FIG. 4E, source/drain electrodes 35 and a metal layer 36' are formed on the second insulating layer 34, so as to contact the active layer 33, via the first and second openings 34a and 34b, respectively. Accordingly, the metal layer 36' is connected to the active layer 33 via the second opening 34b and protects a central portion of the active layer 33, which operates as a channel, from water and/or oxygen. The metal layer 36' may be generally T-shaped, in cross-section.

Figure 4F:
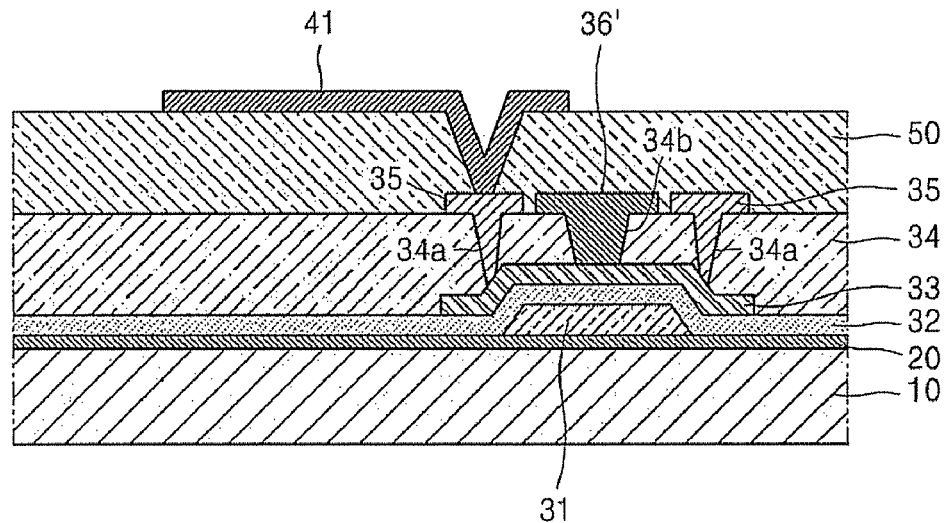
Figure 4G:
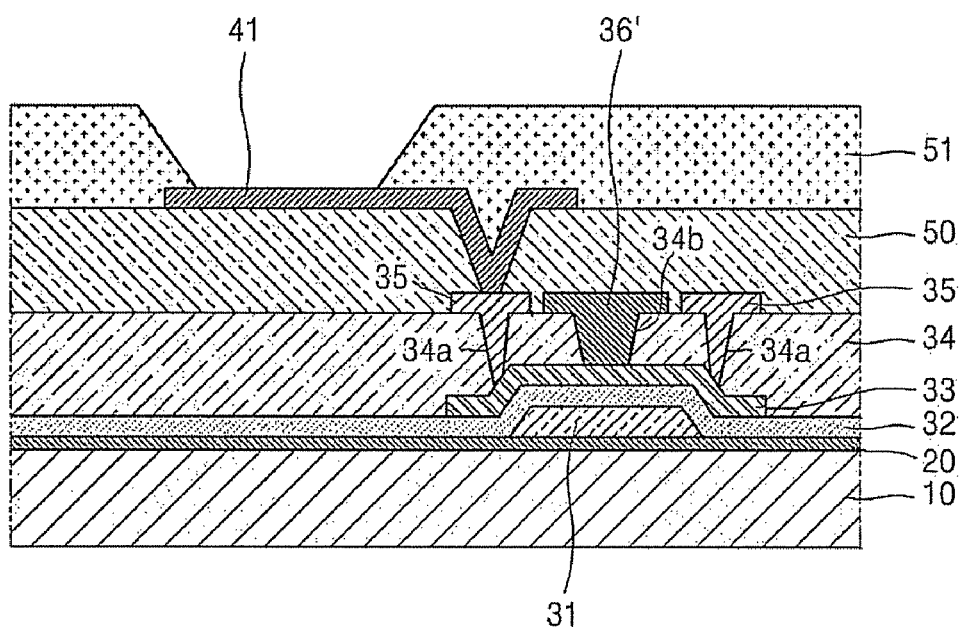

Referring to FIG. 4F, a passivation layer 50 is formed on the second insulating layer 34. A pixel electrode 41 is formed on the passivation layer 50 and is connected to one of the source/drain electrodes 35. Referring to FIG. 4G, a pixel defining layer 51 is formed on the passivation layer 50 and the pixel electrode.

Figure 4H:
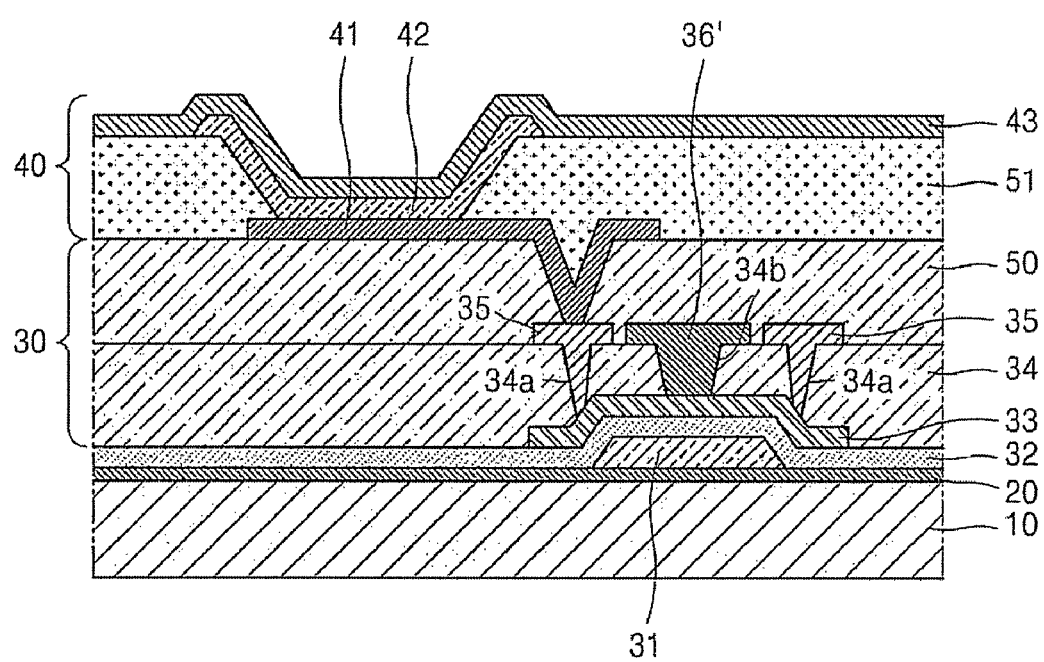

Referring to FIG. 4H, an organic emission layer 42 is formed on the pixel electrode 41, and an opposite electrode 43 is formed on the organic emission layer 42. Although not shown, a protection layer is formed on the opposite electrode 43, and a transparent substrate covers the organic light-emitting display device, to seal the same.

As described above, an organic light-emitting display device, according to an exemplary embodiment of the present invention, includes a metal layer that covers an active layer, to protect the active layer from the penetration of water and/or oxygen. Thus, damage to the active layer may be prevented, thereby increasing the lifespan and image formation stability of the organic light-emitting display device. In addition, according to the above-described embodiments, the source/drain electrodes 35 and the metal layer 36 may be formed on the same layer, and thus, there is no need to increase the number of operations of a manufacturing process.

Although a few exemplary embodiments of the present invention have been shown and described, it would be appreciated by those skilled in the art that changes may be made in these exemplary embodiments, without departing from the principles and spirit of the invention, the scope of which is defined in the claims and their equivalents.

What is claimed is:

1. An organic light-emitting display device, comprising:
a gate electrode formed on a substrate;
a first insulating layer formed on the gate electrode;
an active layer formed on the first insulating layer and facing the gate electrode;
a second insulating layer formed on the first insulating layer and having first openings to expose the active layer;
source/drain electrodes formed on the second insulating layer and connected to the active layer through the first openings of the second insulating layer; and
a metal layer formed on the active layer and contacting the second insulating layer;
wherein the metal layer is formed on the second insulating layer and extends through a second opening formed in the second insulating layer so as to directly contact a central portion of the active layer.

2. The organic light-emitting display device of claim 1, wherein the metal layer and the source/drain electrodes are coplanar.

3. The organic light-emitting display device of claim 1, wherein the active layer comprises an oxide semiconductor.

4. The organic light-emitting display device of claim 1, further comprising a buffer layer for planarizing the substrate.

5. An organic light-emitting display device, comprising:
a gate electrode formed on a substrate;
a first insulating layer formed on the substrate and covering the gate electrode;
an active layer formed on the first insulating layer and facing the gate electrode;
a metal layer formed directly on the active layer;
a second insulating layer formed on the first insulating layer and the active layer; and
source/drain electrodes formed on the second insulating layer and extending through the second insulating layer so as to contact the active layer;
wherein the metal layer and the source/drain electrodes are coplanar.

6. The organic light-emitting display device of claim 5, wherein the metal layer covers a channel region of the active layer so as to prevent the infiltration of at least one of moisture and water into the channel region.

7. The organic light-emitting display device of claim 5, wherein the metal layer is one of T-shaped and trapezoidal in cross-section.

8. An organic light-emitting display device, comprising:
a gate electrode formed on a substrate;
a first insulating layer formed on the gate electrode;
an active layer formed on the first insulating layer and facing the gate electrode;
a second insulating layer formed on the first insulating layer and having first openings to expose the active layer;
source/drain electrodes formed on the second insulating layer and connected to the active layer through the first openings of the second insulating layer; and
a metal layer formed on the active layer and contacting the second insulating layer;
wherein the metal layer and the source/drain electrodes are coplanar.

9. An organic light-emitting display device, comprising:
a gate electrode formed on a substrate;
a first insulating layer formed on the substrate and covering the gate electrode;

an active layer formed on the first insulating layer and facing the gate electrode;
a metal layer formed directly on the active layer;
a second insulating layer formed on the first insulating layer and the active layer; and
source/drain electrodes formed on the second insulating layer and extending through the second insulating layer to contact the active layer;
wherein the metal layer is one of T-shaped and trapezoidal.

10. An organic light-emitting display device, comprising:
a gate electrode formed on a substrate;
a first insulating layer formed on the substrate and covering the gate electrode;
an active layer formed on the first insulating layer and facing the gate electrode;
a second insulating layer formed on the first insulating layer and having an opening to expose the active layer;
a metal layer formed on the second insulating layer and extending through the opening so as to directly contact a central portion of the active layer; and
source/drain electrodes formed on the second insulating layer and extending through the second insulating layer so as to contact the active layer.

* * * * *